United States Patent [19]
Tomita

[11] Patent Number: 5,210,863
[45] Date of Patent: May 11, 1993

[54] MULTI-PROCESSOR SYSTEM FOR DETECTING A MALFUNCTION OF A DUAL PORT MEMORY

[75] Inventor: Hiroshi Tomita, Osaka, Japan
[73] Assignee: Minolta Camera Kabushiki Kaisha, Osaka, Japan
[21] Appl. No.: 473,818
[22] Filed: Feb. 2, 1990
[30] Foreign Application Priority Data
  Feb. 3, 1989 [JP] Japan ............... 1-24957
[51] Int. Cl.$^5$ ............................. G06F 11/00
[52] U.S. Cl. ........................ 395/575; 364/241.1; 364/242; 364/265.3; 364/DIG. 1; 364/941; 364/DIG. 2; 371/16.1
[58] Field of Search .......... 395/575; 364/239, 241.2, 364/242, 242.1, 265.3, 941; 371/16.1

[56] References Cited
U.S. PATENT DOCUMENTS
4,953,074  8/1990  Kametani et al. ............... 364/200

FOREIGN PATENT DOCUMENTS
62-242268  10/1987  Japan .

*Primary Examiner*—Charles E. Atkinson
*Attorney, Agent, or Firm*—Burns, Doane, Swecker & Mathis

[57] ABSTRACT

A multi-processor system wherein two processors are connected through a dual port memory which receives from one of the processors an interruption request signal together with the data to be transmitted to the other processor. The dual port memory then generates an interrupt signal for the other processor so that the other processor can fetch the data from the dual port memory using an interrupt procedure. The one processor also receives the interrupt signal transmitted by the dual port memory in order to confirm the status of the interrupt signal generating function of the dual port memory.

15 Claims, 4 Drawing Sheets

MULTI-PROCESSOR SYSTEM FOR DETECTING A MALFUNCTION OF A DUAL PORT MEMORY

FIELD OF THE INVENTION

The present invention relates to multi-processor systems wherein communication is conducted between two processors via a dual port memory, and more particularly to such a multi-processor system having a device for detecting the malfunction of the dual port memory.

BACKGROUND OF THE INVENTION

Conventional multi-processor systems adapted to transmit data between a processor A and a processor B have a dual port memory (hereinafter referred to as the "DPM") which is a common memory accessible from both the processors A and B as desired for the transmission of data between the processors (Japanese Laid-Open Patent Application No. 62-242268).

The DPM has the function of generating an interrupt signal for one of the processors in response to an interrupt request signal from the other processor.

The interrupt request to be made by the processor A for the processor A to communicate with the processor B is accomplished by the processor A by writing data at a specified address in the DPM. Upon the processor A writing the data at the specified address, the control circuit of the DPM, monitoring address signals from both the processors, feeds an interrupt signal to the processor B for the request of interrupt. Upon accepting the interrupt signal, the processor B performs its interrupt processing routine to read out the data from the address in the DPM.

However, the method employed by the conventional multi-processor system for detecting the malfunction of the DPM is merely such that one of the processors, when writing the specified data in the DPM, reads out the stored data to check whether it is identical with the specified data. Accordingly, despite the interrupt request made by the processor, the other processor is unable to recognize the request in the event of malfunctioning of the DPM. Further if the interrupt signal generating function of the DPM has failed, the DPM and both the processors are unable to check whether this function is faulty. Thus, the conventional system requires considerable time for trouble-shooting.

SUMMARY OF THE INVENTION

Accordingly, the main object of the present invention is to provide a multi-processor system having an improved capability to detect failures.

Another object of the present invention is to provide a multi-processor system including a dual port memory and a capability of detecting failures in the interrupt signal generating function of the memory.

Still another object of the present invention is to provide a multi-processor system wherein communication can be conducted between the processors even when the interrupt signal generating function of the dual port memory has failed.

In a multi-processor system, two processors are connected through a dual port memory. When the dual port memory receives from one of the processors an interrupt request signal together with the data to be transmitted to the other processor, it generates an interrupt signal for the other processor so that the other processor can fetch the data from the dual port memory using an interrupt procedure. These and other objects are achieved by returning the interrupt signal to the one processor, to thereby confirm the status of the interrupt signal generating function of the dual port memory.

According to another aspect of the present invention, the interrupt request signal is returned to the one processor together with the interrupt signal, to confirm the status of the interrupt request signal generating function of one processor.

According to a further aspect of the present invention, the interrupt signal is returned to the one processor together with the interrupt request signal to recognize various malfunction states based on these returned signals.

According to a still further aspect of the present invention, the interrupt request signal is supplied to the other processor through an OR gate to which the interrupt signal is provided from the dual port memory. Consequently the other processor can perform the interrupt procedure even though the interrupt signal generating function of the dual port memory has malfunctioned.

BRIEF DESCRIPTION OF THE DRAWINGS

These and other objects or features of the present invention will become apparent from the following description of a preferred embodiment thereof taken in conjunction with the accompanying drawings, in which.

In the following description, like parts are designated by like reference numbers throughout the several drawings.

DETAILED DESCRIPTION OF THE PREFERRED EMBODIMENT

Figure 1:
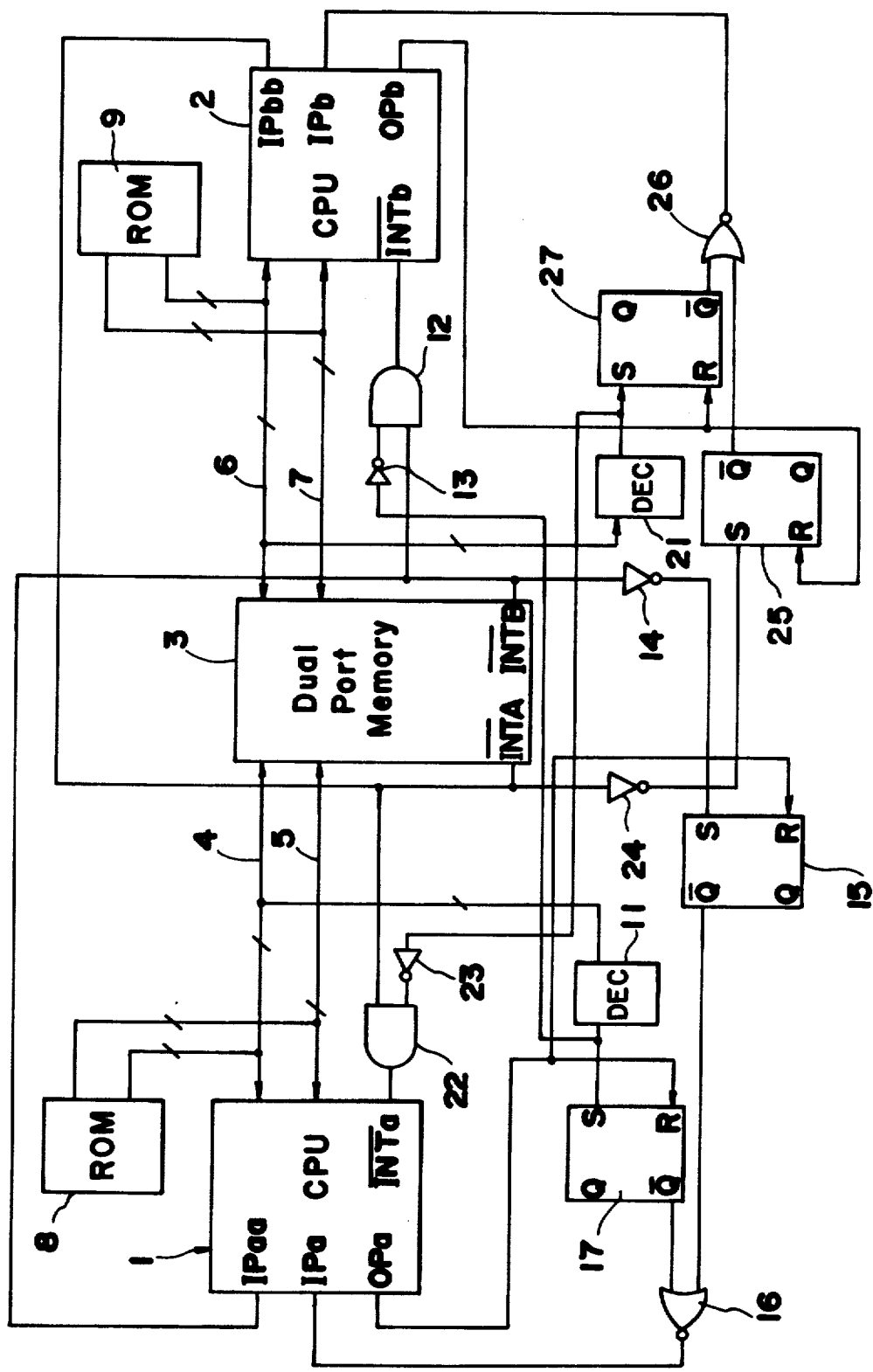
FIG. 1 is a circuit diagram showing a multi-processor system of the present invention.

With reference to FIG. 1, the illustrated multi-processor system embodying the invention has first and second microprocessors (hereinafter referred to as the "CPUs") 1, 2, and a dual port memory (DPM) 3 for communication between the two CPUs. The DPM 3 is connected to the first CPU 1 by an address bus 4 and a data bus 5 which are bidirectional bus lines. Similarly, the DPM 3 is connected to the second CPU 2 by an address bus 6 and a data bus 7. Indicated at 8, 9 are ROMs provided in corresponding relation to the first and second CPUs 1, 2, respectively.

The DPM 3, which has a memory capacity for example of 2 KB, is accessible by the first and second CPUs 1, 2 and transmits data from one CPU to the other CPU in the following manner. One of the CPUs writes at a specified address in the DPM 3 the data to be transmitted to the other CPU. In response to the writing of the data at the specified address, the DPM 3 feeds an interrupt signal to an interrupt terminal of the other CPU, causing the other CPU to perform an interrupt routine. In the interrupt routine, the other CPU accesses the DPM 3 to read out the data from the specified address. The DPM 3 has terminals $\overline{\text{INTA}}$ and $\overline{\text{INTB}}$ for feeding interrrupt signals to the first and second CPUs 1, 2, respectively.

To realize the interrupt function and the malfunction detecting function of the present invention, the present system has circuit groups of the same construction for the respective first and second CPUs 1, 2. The circuit group will be described first which operates for transmitting data from the first CPU 1 to the second CPU 2.

The address bus 4 from the first CPU 1 to the DPM 3 has a branch connected to an address decoder 11. When the first CPU 1 outputs address data specifying a predetermined address in the DPM 3, for example, "07FF" (hexadecimal number) to initiate data transmission, the address decoder 11 decodes the address data and changes its output to "H" level.

When specific data, e.g., "FF" is written in the predetermined address ("07FF"), the DPM 3 produces "L" level signal from the terminal INTB according to this data. The terminal INTB is connected via an AND circuit 12 to an interrupt terminal INTb of the second CPU 2. The other input terminal of the AND circuit 12 is connected to the output terminal of the address decoder 11 via an inverter 13. The interrupt terminal INTb of the second CPU 2 is low-active, and the second CPU 2 starts an interrupt procedure in response to the "L" signal from the terminal INTB or the "H" signal from the address decoder 11.

The terminal INTB is also connected to an input port IPaa of the first CPU 1 directly and to an input port IPa of the first CPU 1 via an inverter 14, flip-flop 15 and NOR circuit 16. The inverter 14 is connected to the set terminal S of the flip-flop 15. The output terminal Q̄ of the flip-flop 15 is connected to one of the input terminals of the NOR circuit 16.

On the other hand, the output terminal of the address decoder 11 is connected to the set terminal S of the flip-flop 17, the output terminal Q̄ of which is connected to the other input terminal of the NOR circuit 16.

The reset terminals R of the flip-flops 15, 17 are connected to an output port OPa of the first CPU 1, which applies a reset signal to these terminals, for example, for initialization.

The circuit group which operates for transmitting data from the second CPU 2 to the first CPU 1 has the same construction as the circuit group already described above and therefore will not be described. Each circuit in this group is designated by the reference number of the corresponding circuit in the foregoing group, with the digit in the tens position changed from "1" to "2".

Next, the operation of the foregoing circuit group will be described for transmitting data from the first CPU 1 to the second CPU 2. Incidentally, the other group of circuits designated by the reference numbers with "2" in the tens position operates in the same manner as this group when transmitting data from the second CPU 2 to the first CPU 1.

For data transmission, the first CPU 1 first writes in the DPM 3 the data to be transmitted, and subsequently specifies through the address bus 4 the predetermined address ("07FF") in the DPM 3 and writes at this address the predetermined status data "FF" indicating an interrupt. The address decoder 11, monitoring the address data through the address bus 4, changes its output to "H" when the predetermined address ("07FF") is specified.

When the predetermined address ("07FF") is specified, the DPM 3 produces an interrupt signal of "L" level from its output terminal INTB, feeding this signal to the interrupt terminal INTb of the second CPU 2 by way of the AND circuit 12.

On receiving the interrupt signal at the interrupt terminal INTb, the second CPU 2 starts an interrupt procedure, in which the second CPU 2 reads out the data from the DPM 3, whereby the data is transmitted from the first CPU 1 to the second CPU 2.

The "L" level output from the INTB terminal of the DPM 3 is fed through the NOT circuit 14 to the flip-flop 15 and the "L" level output from the Q̄ terminal thereof is fed to the NOR circuit 16. On the other hand, the "H" output of the address decoder 11 is applied to the flip-flop 17, which in turn feeds from its Q̄ terminal an "L" level output to the NOR circuit 16. Consequently, the NOR circuit 16 feeds an output of "H" level to the input terminal IPa of the first CPU 1. The "L" level output of the terminal INTB of the DPM 3 is fed also to the input terminal IPaa of the first CPU 1 directly.

The state of the input terminals IPa and IPaa of the first CPU 1 serves to detect malfunctions along with a flag F for indicating that the first CPU 1 has delivered the specified data to the DPM 3 for data transmission.

Table 1 below shows the flag F and the terminals in various states. The flag F becomes "H" when data is transmitted and is otherwise "L".

TABLE 1

|      | I | II | III | IV | V | VI |
|------|---|----|-----|----|---|----|
| H    | H | L  | H   | L  | L | H  |
| IPa  | H | L  | L   | L  | H | L  |
| IPaa | L | H  | H   | L  | L | L  |

Cases I and II show that the system is in the normal state when data is transmitted and while no data is transmitted, respectively.

Cases III to VI each show an abnormal state. Case III indicates that the interrupt signal generating function of the DPM 3 is faulty, with the terminal INTB failing to give the "L" level output, or that the first CPU 1 fails to produce the normal output. In the case where the interrupt signal generating function of the DPM 3 is faulty, an interrupt signal is delivered from the address bus 4 to the second CPU 2 by way of the address decoder 11, NOT circuit 13 and AND circuit 12 instead of being afforded by the DPM 3. This backup function enables the second CPU 2 to receive the data to be transmitted. The first CPU 1 recognizes which of the DPM 3 and the first CPU 1 is at fault by reading out again and checking the data which should have been written in the DPM 3. If the data which should have been written is found correct, this indicates that the DPM 3 is faulty. If otherwise, the first CPU 1 itself is in error.

Case IV indicates that although no addressing has been done for data transmission, the output terminal INTB of the DPM 3 remains at "L" level in error.

Case V shows that although the first CPU 1 executes no data transmission procedure as its internal processing routine, addressing is done for data transmission via the address bus 4, hence an abnormal output of the first CPU 1.

Case VI indicates that the address decoder 11 or the flip-flop 17 is at fault.

In the event of these faulty cases, the first CPU 1 gives an error display and follows a procedure for the particular error. For example, in the event of the faulty interrupt signal generating function of DPM 3 in case III, the system is held in operation although locally since data can be transmitted by virtue of the backup function. If the current process can not be continued, the routine to be performed by the first CPU 1 is interrupted, with the error display held on. The state of the flag F and the terminals IPa and IPaa given in Table 1 may be preserved so as to be retrieved for troubleshooting. The faulty can then be located readily.

Figure 2:
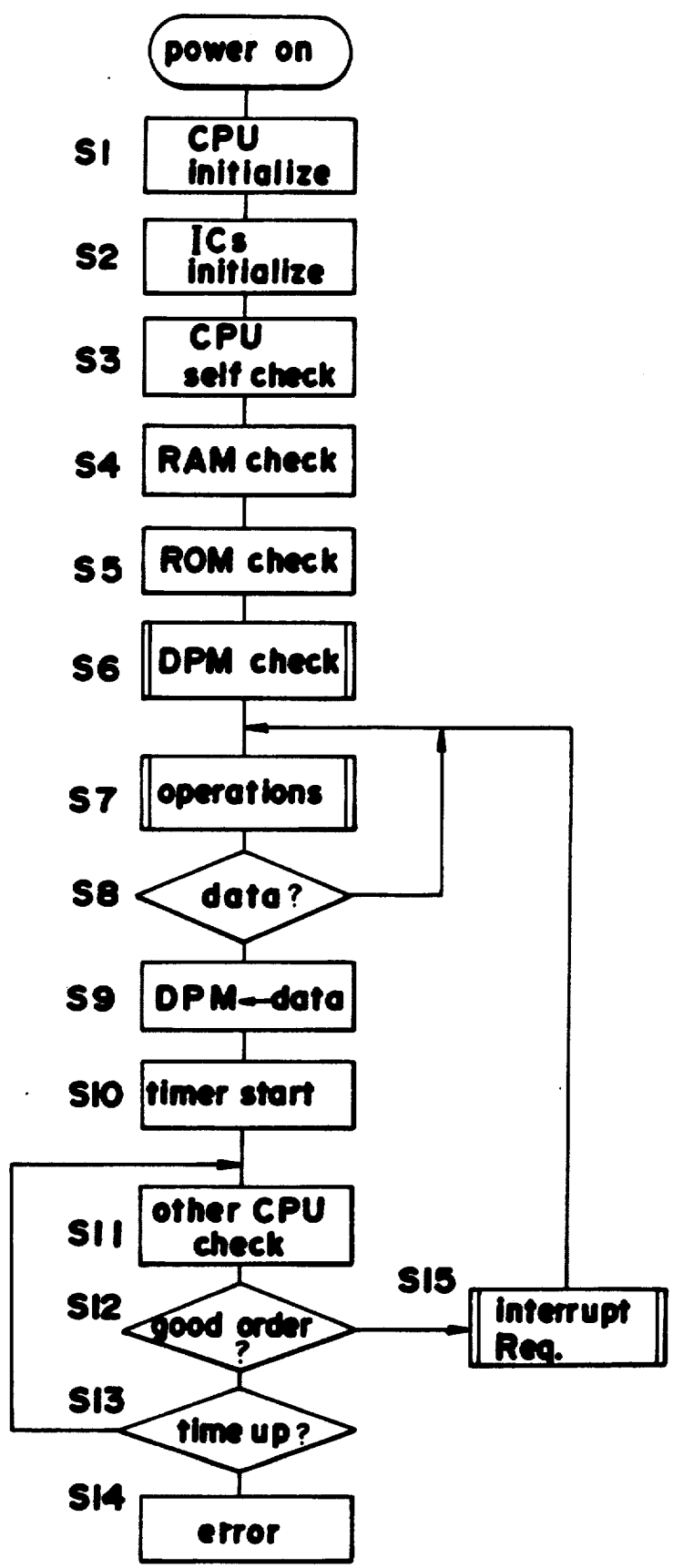
FIG. 2 is a flow chart showing the main program of a processor used in the above multi-processor system.
Figure 3:
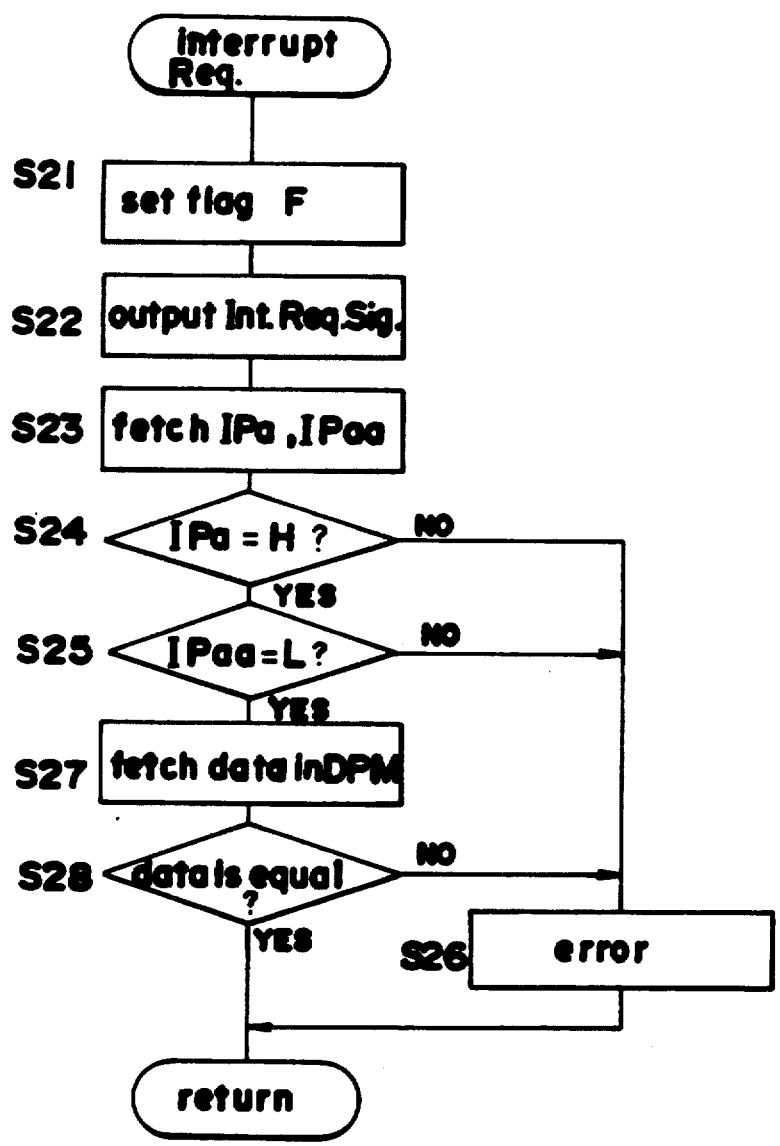
FIGS. 3 and 4 are flow charts showing subroutine programs of the processor.
Figure 4:
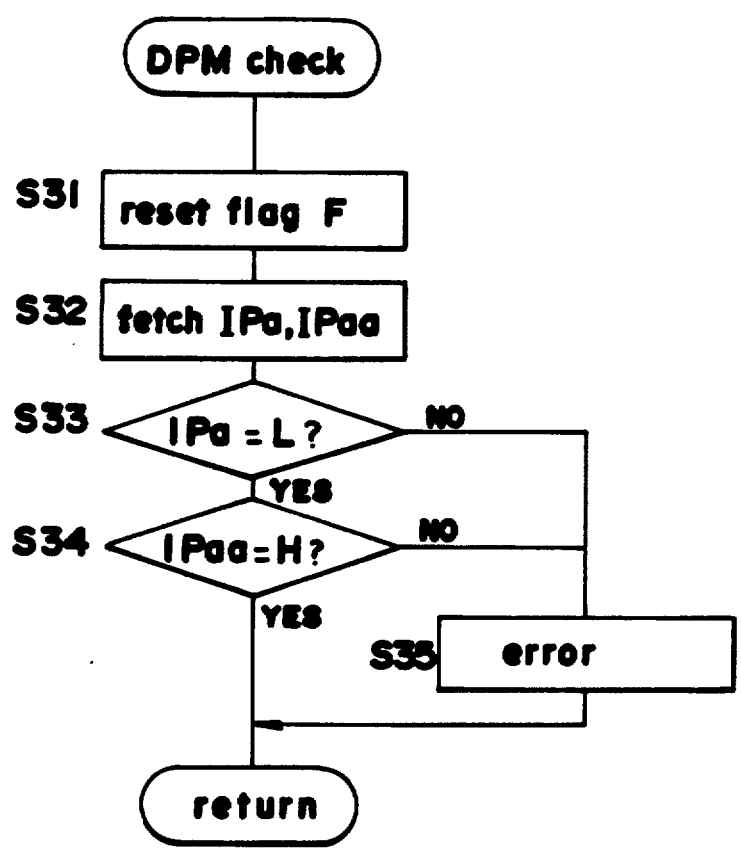

FIGS. 2, 3 and 4 are flow charts schematically showing the programs to be executed by the first CPU 1.

With reference to the main routine of FIG. 2, the CPU 1 is initialized in step S1 after the power supply has been turned on. In step S2, the ICs connected to the CPU 1 are initialized. Subsequently, the CPU 1 self-checks in step S3, and checks the RAM, ROM and DPM in steps S4, S5 and S6, respectively. Step S6 of checking the DPM will be described in detail later.

In the next step S7, the CPU 1 performs the job given. In this procedure, step S8 inquires whether there is the data to be transmitted to the second CPU 2. If the answer is affirmative, the data is written in the predetermined area of the DPM (step S9). In step S10, a timer is started which defines a period of time sufficiently longer than the time taken for the data to be sent to the DPM and then read out by the second CPU 2. If this procedure has not been completed within the specified period of time, this indicates some malfunction or error, which is therefore to be processed subsequently.

The following step S11 checks whether the data sent out by the preceding communication process has been completely processed. When having completely read out the data from the DPM, the second CPU 2 sets in a specified area of the DPM a flag indicating the completion, so that step S11 checks this flag. When step S12 shows that the data has been completely processed, the sequence proceeds to the interrupt request subroutine of step S15. If the processing has not been completed, the timer is checked in step S13 as to whether the time is up. When the answer to the inquiry is affirmative, step S14 follows for error processing.

FIG. 3 is a flow chart showing the interrupt request subroutine of step S15. First, the flag F is set in step S21. An interrupt request signal is then fed to the DPM in step S22. This is accomplished by specifying the predetermined address of the DPM and writing at the address status data representing the interrupt request. In response to this step, the DPM feeds an interrupt signal from the terminal INTB thereof to the second CPU as already described. In the following step S23, the states of the input ports IPa and IPaa of the CPU 1 are fetched, and these states are recognized in steps S24 and S25. In this stage, the interrupt request is being processed, so that if the input port IPa is "L" level or the input port IPaa is at "H" level, this indicates that some malfunction has occurred. In this case, therefore, step S26 follows for error processing. In steps S27 and S28 subsequent to step S25, the data written in the DPM is retrieved and compared with the data to be transmitted and preserved in the first CPU 1. If the compared items of data fail to match, the error processing of step 26 follows.

FIG. 4 is a flow chart showing step S6 in the flow chart of FIG. 2, i.e., the subroutine of checking the DPM. In this subroutine, the states of circuits around the DPM are checked in the absence of the interrupt request. First, the flag F showing the state in which the interrupt request is made is reset in step S31. In step S32, the states of the input ports IPa and IPaa are fetched. These states are recognized in steps S33 and S34. As already shown in Table 1, IPa=L and IPaa=H are the normal states when no interrupt request is made. If the states are otherwise, step S35 follows for error processing. In step S35, an error display is given, and the states of the flag F and the ports IPa and IPaa are stored in a predetermined area of the RAM.

The multi-processer system of the present invention described above is so adapted that when data is to be transmitted from one of the CPUs to the other CPU via the DPM, an interrupt signal fed from the DPM to the other CPU is fed back to the one CPU, whereby the interrupt signal generating function of the DPM can be checked. Further when an interrupt request signal (addressing signal specifying a predetermined address of the DPM) is sent from the one CPU to the DPM, this signal is fed back to the one CPU together with the interrupt signal. Accordingly, the interrupt request signal generating function of the one CPU can also be checked at the same time. Additionally, the interrupt request signal serves a backup function when the interrupt signal generating function of the DPM fails. This permits data transmission even in the event of the failure of the interrupt signal generating function to give improved reliability to the system.

Although the present invention has been fully described by way of example with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A multi-processor system, comprising:
   two processors;
   a dual port memory means for receiving from one of the processors an interrupt request signal together with data to be transmitted to the other processor and for transmitting an interrupt signal to said other processor;
   said other processor having means for fetching said data from said dual port memory means during an interrupt procedure responsive to said interrupt signal; and
   means, in said one processor and responsive to said interrupt signal transmitted from the dual port memory means to said other processor in response to said interrupt request signal generated from said one processor, for confirming the status of the interrupt signal generating function of said dual port memory means.

2. A multi-processor system as claimed in claim 1, wherein said one processor includes
   means, responsive to said interrupt request signal generated by said one processor and said interrupt signal transmitted to said other processor, for confirming the status of the interrupt request signal generating function of said one processor.

3. A multi-processor system as claimed in claim 1, wherein said one processor includes means for receiving said interrupt signal logically combined with said interrupt request signal.

4. A multi-processor system as claimed in claim 1, wherein said interrupt request signal and said interrupt signal are supplied to said other processor through a logic gate, said other processor performing said interrupt procedure even though said interrupt signal generating function of said dual port memory means malfunctions.

5. A multi-processor system having two processors, a dual port memory means for receiving from one of the processors an interrupt request signal together with data to be transmitted to the other processor and for transmitting an interrupt signal to said other processor, said other processor having means for fetching said data from said dual port memory means during an interrupt procedure responsive to said interrupt signal, said multi-processor system comprising:
   a first means for returning said interrupt signal transmitted by said dual port memory means to said other processor to said one processor; and
   a second means for returning said interrupt signal transmitted by said dual port memory means to said one processor to said other processor;
   wherein both said one and said other processor can confirm the status of the interrupt signal generating function of the dual port memory means.

6. A multi-processor system as claimed in claim 5, wherein said first means includes first circuit means through which said interrupt request signal generated by said one processor is returned to said one processor together with said interrupt signal for the other processor, and the second means includes second circuit means through which said interrupt request signal generated by said other processor is returned to said other processor together with said interrupt signal for said one processor.

7. A multi-processor system as claimed in claim 6, wherein each of said interrupt signals is returned and logically combined with said interrupt request signal.

8. A multi-processor system as claimed in claim 5, wherein each of the first and second means includes a logic gate through which said interrupt request signal and said interrupt signal are supplied to a corresponding processor, said corresponding processor performing an interrupt procedure even though said interrupt signal generating function of the dual port memory means malfunctions.

9. A multi-processor system, comprising:
   first and second processors each having a data input/output terminal for receiving and transmitting data, an output terminal for transmitting an interrupt request signal and an input terminal for receiving an interrupt signal, each processor performing an interrupt procedure based on said signals;
   a memory having data input/output terminals for receiving and transmitting data, input terminals for receiving said interrupt request signals and output terminals for outputting said interrupt signals, said memory outputting said interrupt signal together with said data to be transmitted to one of said processors when said interrupt request signal is received from the other of said processors;
   first circuit means for returning said interrupt signal transmitted from said memory to said second processor to said first processor; and
   second circuit means for returning said interrupt signal transmitted from said memory to said first processor to said second processor.

10. A multi-processor system as claimed in claim 9, wherein each of said first and second circuit means returns only said interrupt signal to a corresponding one of said processors which generates said interrupt request signal.

11. A multi-processor system as claimed in claim 9, wherein each of said first and second circuit means returns said interrupt signal logically combined with said interrupt request signal to a corresponding one of said processors which generates said interrupt request signal.

12. A multi-processor system as claimed in claim 9, wherein each of said first and second circuit means includes a signal line which returns only said interrupt signal and another signal line which returns said interrupt signal logically combined with said interrupt request signal.

13. A multi-processor system as claimed in claim 9, further including:
   third circuit means, connected between said memory and said second processor, including a logic gate for receiving said interrupt signal from said memory and said interrupt request signal from said first processor and for outputting a signal to said input terminal of said second processor; and
   fourth circuit means, connected between said memory and said first processor, including a logic gate for receiving said interrupt signal from said memory and said interrupt request signal from said second processor and for outputting a signal to said input terminal of said first processor.

14. A multi-processor system comprising:
   a first processor;
   a second processor;
   a dual port memory means for receiving from said first processor an interrupt request signal and for transmitting an interrupt signal to said second processor; and
   an interrupt transmission means for transmitting another interrupt signal from said first processor to said second processor without interaction with said dual port memory means.

15. A multi-processor system as claimed in claim 14, further comprising;
   a logic gate receiving said interrupt signal from said dual port memory means and said another interrupt signal from said interrupt transmission means for outputting an interrupt signal to said second processor.

* * * * *